US012775031B2

(12) United States Patent
Kamani et al.

(10) Patent No.: US 12,775,031 B2
(45) Date of Patent: Oct. 27, 2026

(54) BACKPOWER-RESISTANT CURRENT SENSING SYSTEMS AND METHODS

(71) Applicant: Apple Inc., Cupertino, CA (US)

(72) Inventors: Deepesh H Kamani, Swindon (GB); Michael P Wigley, Swindon (GB); Ramakrishna Ravi, Swindon (GB); Vincenzo Bisogno, Swindon (GB)

(73) Assignee: Apple Inc., Cupertino, CA (US)

( * ) Notice: Subject to any disclaimer, the term of this patent is extended or adjusted under 35 U.S.C. 154(b) by 518 days.

(21) Appl. No.: 18/101,945

(22) Filed: Jan. 26, 2023

(65) Prior Publication Data

US 2024/0103049 A1 Mar. 28, 2024

Related U.S. Application Data

(60) Provisional application No. 63/409,574, filed on Sep. 23, 2022.

(51) Int. Cl.
*G01R 19/165* (2006.01)
*G01R 19/00* (2006.01)
*H03K 17/082* (2006.01)

(52) U.S. Cl.
CPC ... *G01R 19/16576* (2013.01); *G01R 19/0038* (2013.01); *G01R 19/16571* (2013.01)

(58) Field of Classification Search
CPC .. G01R 19/00; G01R 19/0038; G01R 19/165; H03K 17/082
See application file for complete search history.

(56) References Cited

U.S. PATENT DOCUMENTS

| | | | | |
|---|---|---|---|---|
| 9,076,805 | B2 | 7/2015 | Thiele et al. | |
| 9,360,879 | B2 | 6/2016 | Levhar et al. | |
| 9,684,325 | B1 * | 6/2017 | Rasmus | G05F 1/575 |
| 10,156,592 | B2 | 12/2018 | Shuvalov | |
| 10,852,329 | B2 | 12/2020 | Fernandez et al. | |
| 2016/0164279 | A1 | 6/2016 | Asam et al. | |
| 2023/0308089 | A1 * | 9/2023 | Del Croce | H02H 3/025 |

* cited by examiner

*Primary Examiner* — Neel D Shah
(74) *Attorney, Agent, or Firm* — Fletcher Yoder, P.C.

(57) ABSTRACT

This disclosure is directed towards systems and methods that may prevent backpowering of a voltage source during a current monitoring operation. In a first example circuit, a switch may be used to mitigate an offset voltage of an operational amplifier. In a second and third example, a resistor may be used to generate an opposing voltage to the offset voltage to mitigate the offset voltage of the operational amplifier. Other examples are described that may mitigate sensing dead zones of some of the solutions and/or that may mitigate temperature variations changing an effectiveness of the mitigation.

20 Claims, 9 Drawing Sheets

BACKPOWER-RESISTANT CURRENT SENSING SYSTEMS AND METHODS

CROSS-REFERENCE TO RELATED APPLICATIONS

This application claims priority to U.S. Application No. 63/409,574, entitled "BACKPOWER-RESISTANT CURRENT SENSING SYSTEMS AND METHODS," filed Sep. 23, 2022, which is hereby incorporated by reference in its entirety for all purposes.

BACKGROUND

This disclosure relates to current sensing systems and methods. More specifically, the systems and methods described herein may reduce or eliminate backpowering during current sensing.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices—such as cellular devices, televisions, handheld devices, notebook computers, and more—include a variety of different electronic components. Circuitry such as a power management unit (PMU) may provide an appropriate amount of electricity to the components. The electronic device may monitor the electrical current being provided to the components using current sensing. For example, the electronic device may sense a current as part of a feedback loop to hold a voltage value relatively stable during processing operations, as part of an overcurrent detection operation, or the like. Under certain circumstances, however, undesirable backpowering may occur that could result in an over-voltage condition or higher quiescent current.

SUMMARY

A summary of certain embodiments disclosed herein is set forth below. It should be understood that these aspects are presented to provide the reader with a brief summary of these certain embodiments and that these aspects are not intended to limit the scope of this disclosure.

Certain current sensing operations may use an operational amplifier (op-amp) to monitor a load current for an overcurrent condition. When the load current exceeds a target value, the op-amp may cause a flag or other suitable overcurrent indication to be generated that indicates that the load current has exceeded the target value. To do so, the op-amp may balance a drain voltage of a sense device with that of a pass device. The op-amp may transmit a scaled version of the load current via the sense device as a sense device current. Current mirror circuitry may mirror the sense device current to enable the load current to be monitored. The overcurrent indication may be generated if the sense device current and the load current exceed a target value.

In actual implementation, the op-amp is non-ideal and may have a non-zero voltage present at an input, where the voltage referred to herein as an offset voltage (Vos). The offset voltage (Vos) may be a variable value (e.g., subject to random fluctuations, randomly distributed from op-amp to op-amp in different electronic devices). Indeed, the value of the offset voltage (Vos) could be inconsistent between sensing operations. When the input to the op-amp (e.g., a value of the offset voltage (Vos)) is negative, a circuit loop associated with the current sensing operation may regulate a voltage of a node coupled to the sense device to a voltage value that is higher than a node coupled to the pass device. Since the pass device and the sense device are fully on, a relatively high current may flow into the voltage source (Vin), sending additional, unexpected current of a few hundred of micro-Amps (μA) to the voltage source (Vin). The process of sending current back to the voltage source (Vin) during a current sensing operation may be generally referred to as backpowering the voltage source (Vin). Backpowering the voltage source (Vin) may be undesirable since the additional current flowing into the voltage source (Vin) could damage certain circuitry if it is not made to withstand the additional current.

With this in mind, this disclosure is directed to systems and methods to reduce or eliminate a likelihood of a current sensing operation from backpowering the voltage source (Vin). Indeed, to overcome the offset of the op-amp, a suitable voltage across the load switch (e.g., pass device) may be used before enabling the circuit loop. This may be done by including circuitry (e.g., voltage monitoring circuitry) to enable the equalizing operation of the non-ideal op-amp. By then enabling the equalizing operation, the node voltage (Vsns) of the sense device may be ensured not to be greater than the voltage source (Vin) coupled to the pass device.

In a first example, backpower reduction circuitry may include a comparator and an operational amplifier. The comparator may operate several switches coupled to an output of the comparator based on its output. The output from the comparator may indicate a difference between a voltage drop across the pass device carrying load current and a threshold voltage of a programmable voltages source. The several switches may include a normally open switch and a normally closed switch. Using this structure, a current sensing may be enabled when the difference between a load voltage (Vout) and the voltage of the voltage source (Vin) is greater than an offset of the operational amplifier (e.g., offset voltage (Vos)). This in-turn ensures that the voltage source (Vin) is not backpowered by the load current sensing operation.

In a second example, backpower reduction circuitry may include programmable current sources, a resistor, and an operational amplifier. Control circuitry may program the programmable current sources to generate a current of suitable value to generate a compensation voltage across the resistor. The compensation voltage may be equal but opposite in direction with respect to that of an offset of the operational amplifier (e.g., offset voltage (Vos)). This in-turn ensures that the voltage source (Vin) is not backpowered by the load current sensing operation by compensating for the offset voltage (Vos).

In a third example, additional switching circuitry may be coupled between one or more of the programmable current sources and the resistor. The control circuitry may sense a value of the offset voltage and may change which switches of the additional switching circuitry are closed based on the sensed value of the offset voltage. By doing so, the control circuitry may control a sign of the compensation voltage generated across the resistor, permitting additional control over how to mitigate the offset voltage (Vos).

Other circuitry may be suitable to enable a compensation of an offset affecting a non-ideal operational amplifier (op-amp) by controlling, during a sensing operation, a sense device input current to be less than a pass device input current associated with the non-ideal op-amp. Moreover, in some systems, the first example, the second example, and the example of the circuitry may be used in an electronic device. Additional systems and methods are described herein to address further how to mitigate temperature variations that may change a value of the offset voltage (Vos), as well as how the control circuitry may determine and indicate an inaccurate current sensing result based on an output from the operational amplifier.

BRIEF DESCRIPTION OF THE DRAWINGS

Various aspects of this disclosure may be better understood upon reading the following detailed description and upon reference to the drawings described below.

DETAILED DESCRIPTION

Figure 1:
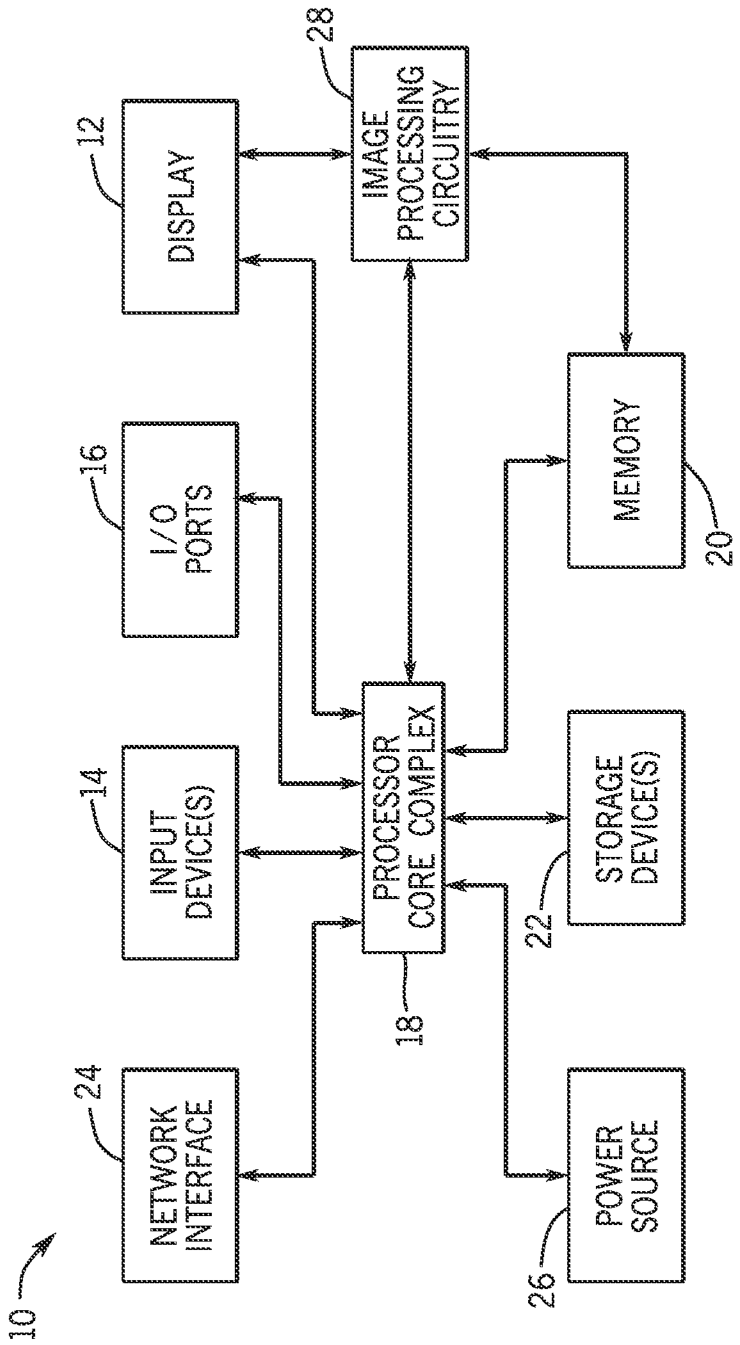
FIG. 1 is a block diagram of an electronic device with an electronic display, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Some sensing operations use a non-ideal operational amplifier (op-amp) that may irregularly experience a value of voltage offset (e.g., a random variation) at one or both input terminals. The presence of the voltage offset may cause backpowering during sensing operations.

This disclosure relates to systems and methods that may reduce or eliminate sending current to (e.g., backpowering) a voltage source during current sensing. Systems and methods described herein may be based on including backpower reduction circuitry to stop backpowering. By not backpowering the voltage source (Vin), technical improvements related to improved device lifespan and improved component perform may be realized. Indeed, devices upstream from the current sensing device, such as the voltage source (Vin), an associated power management integrated circuit (PMIC), or other connected devices, may experience power surges and/or increased current levels during the backpowering. Thus, by mitigating the backpowering experienced during current sensing, device operation and sub-system operation may improve overall by reducing a likelihood of an overcurrent condition occurring, and thus reducing a likelihood that the overcurrent conditions degrade circuit components associated with or coupled to the voltage source over time.

Keeping the foregoing in mind, an electronic device 10 including an electronic display 12 (e.g., display device) is shown in FIG. 1. As is described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

The electronic display 12 may be any suitable electronic display. For example, the electronic display 12 may include a self-emissive pixel array having an array of one or more of self-emissive pixels. Any other suitable type of pixel, including non-self-emissive pixels (e.g., liquid crystal as used in liquid crystal displays (LCDs), digital micromirror devices (DMD) used in DMD displays) may also be used. In the depicted embodiment, the electronic device 10 includes the electronic display 12, one or more input devices 14, one or more input/output (I/O) ports 16, a processor core complex 18 having one or more processor(s) or processor cores, local memory 20, a main memory storage device 22, a network interface 24, a power source 26 (e.g., power supply), and image processing circuitry 28. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component. The image processing circuitry 28 (e.g., a graphics processing unit) may be included in or separate from the processor core complex 18.

The processor core complex 18 may execute instruction stored in local memory 20 and/or the main memory storage device 22 to perform operations, such as generating and/or transmitting image data. As such, the processor core complex 18 may include one or more general purpose microprocessors, one or more application specific integrated circuits (ASICs), one or more field programmable gate arrays (FPGAs), or any combination thereof.

In addition to instructions, the local memory 20 and/or the main memory storage device 22 may store data to be processed by the processor core complex 18. Thus, the local memory 20 and/or the main memory storage device 22 may include one or more tangible, non-transitory, computer-readable mediums. For example, the local memory 20 may include random access memory (RAM) and the main memory storage device 22 may include read-only memory (ROM), rewritable non-volatile memory such as flash memory, hard drives, optical discs, and/or the like.

The network interface 24 may communicate data with another electronic device 10 and/or a network. For example, the network interface 24 (e.g., a radio frequency system) may enable the electronic device 10 to communicatively couple to a personal area network (PAN), such as a Bluetooth network, a local area network (LAN), such as an 1622.11x Wi-Fi network, and/or a wide area network (WAN), such as a 4G or Long-Term Evolution (LTE) cellular network. The power source 26 may provide electrical power to one or more components in the electronic device 10, such as the processor core complex 18 and/or the electronic display 12. Thus, the power source 26 may include any suitable source of energy, such as a rechargeable lithium polymer (Li-poly) battery and/or an alternating current (AC) power converter. In some cases, the power source 26 may include a power management unit that uses current sensing circuitry to control power supply to loads. This will be further described in FIG. 6.

The I/O ports 16 may enable the electronic device 10 to interface with other electronic devices 10. For example, when a portable storage device 22 is connected, the I/O port 16 may enable the processor core complex 18 to communicate data with the portable storage device 22. The input device 14 may enable user interaction with the electronic device 10, for example, by receiving user inputs via a button, a keyboard, a mouse, a trackpad, and/or the like. The input device 14 may include touch-sensing components in the electronic display 12. The touch-sensing components may receive user inputs by detecting occurrence and/or position of an object touching the surface of the electronic display 12.

Figure 2:
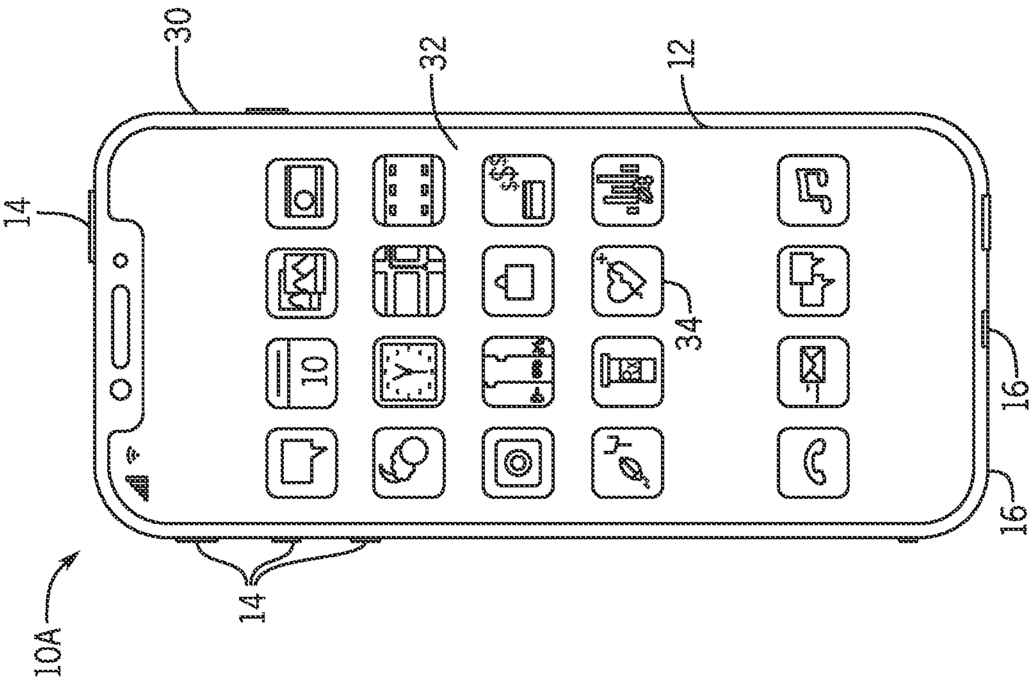
FIG. 2 is an example of the electronic device of FIG. 1, in accordance with an embodiment.

The electronic device 10 may be any suitable electronic device. One example of the electronic device 10, a handheld device 10A, is shown in FIG. 2. The handheld device 10A may be a portable phone, a media player, a personal data organizer, a handheld game platform, and/or the like. For illustrative purposes, the handheld device 10A may be a smart phone, such as any IPHONE® model available from Apple Inc.

The handheld device 10A includes an enclosure 30 (e.g., housing). The enclosure 30 may protect interior components from physical damage and/or shield them from electromagnetic interference, such as by surrounding the electronic display 12. The electronic display 12 may display a graphical user interface (GUI) 32 having an array of icons. When an icon 34 is selected either by an input device 14 or a touch-sensing component of the electronic display 12, an application program may launch.

The input devices 14 may be accessed through openings in the enclosure 30. The input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes.

Figure 3:
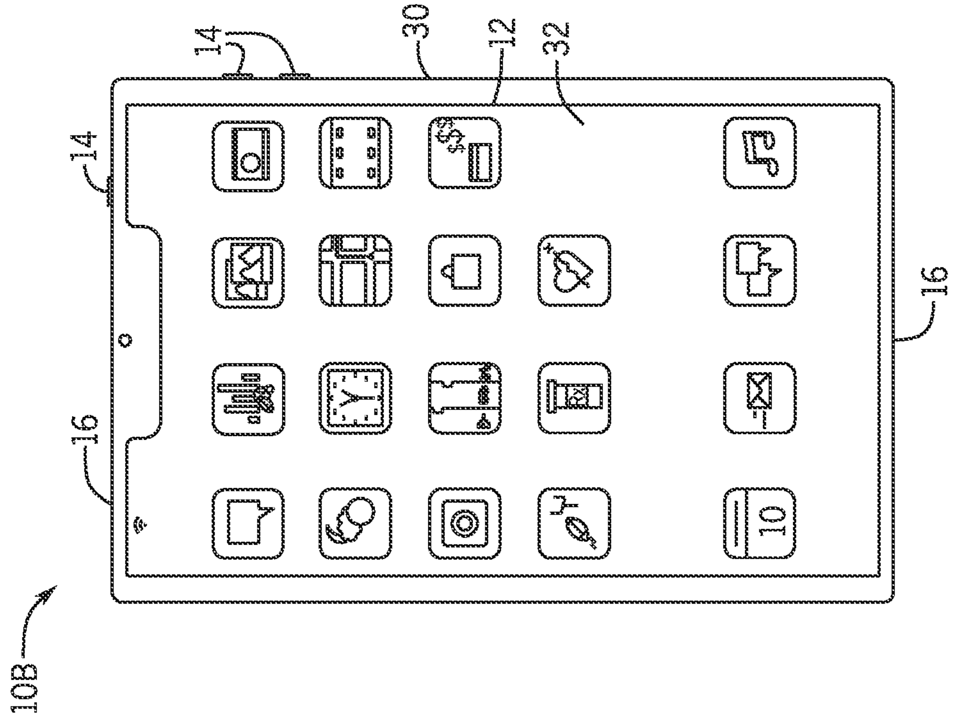
FIG. 3 is another example of the electronic device of FIG. 1, in accordance with an embodiment.
Figure 4:
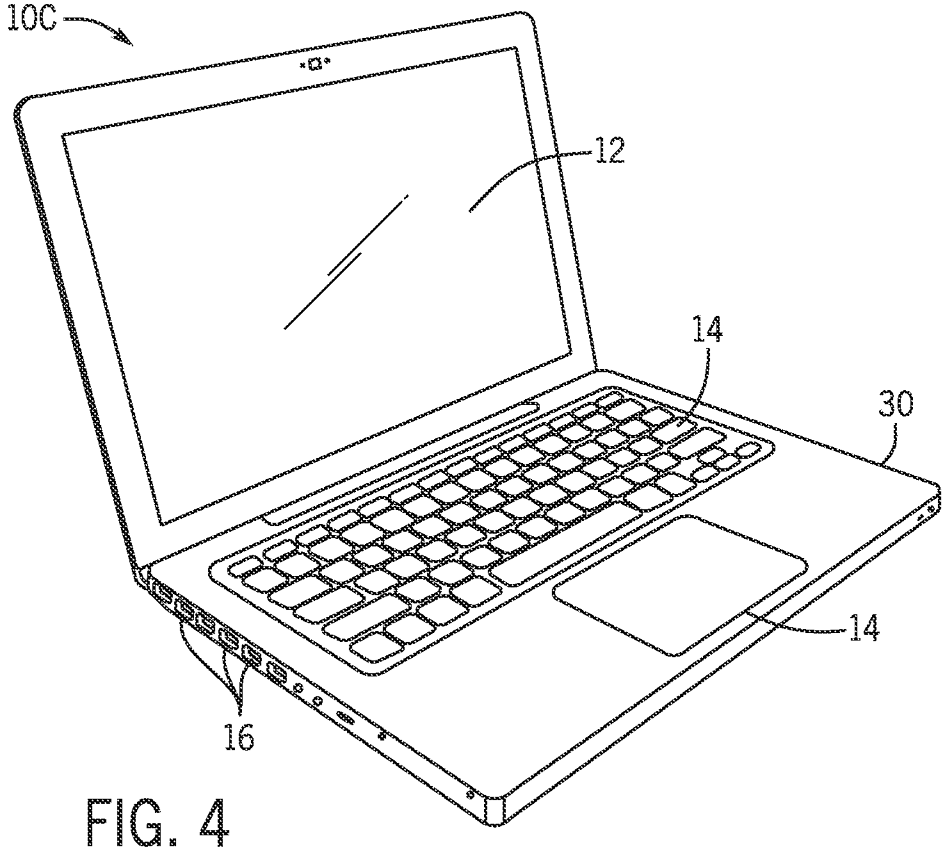
FIG. 4 is another example of the electronic device of FIG. 1, in accordance with an embodiment.
Figure 5:
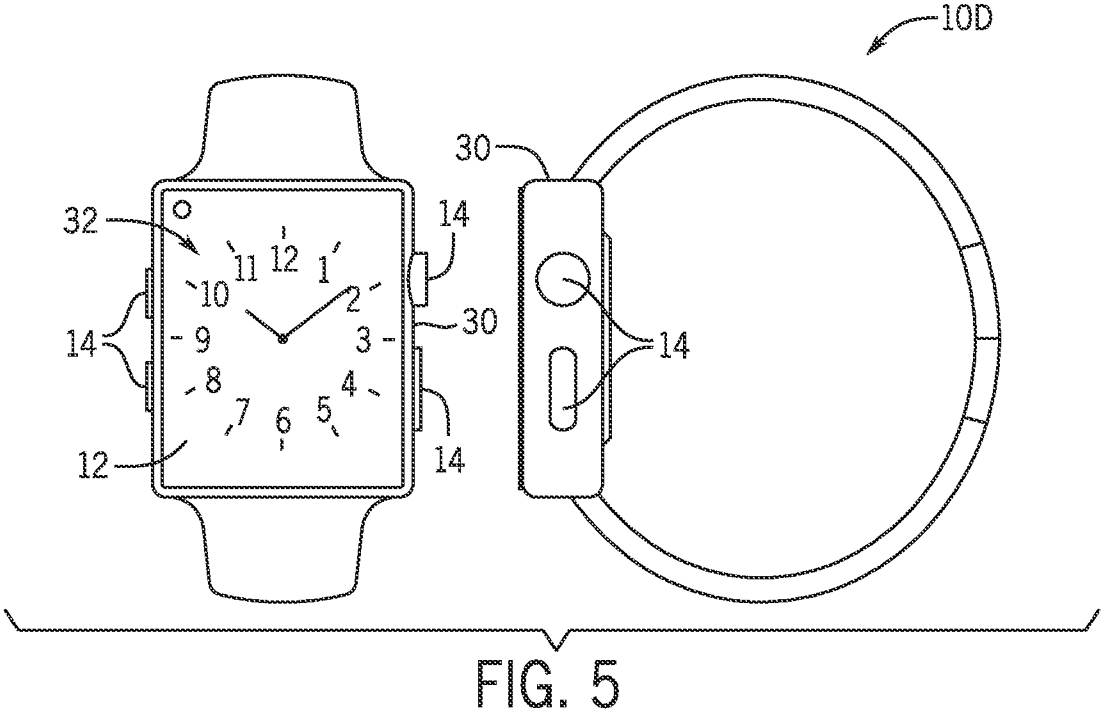
FIG. 5 is another example of the electronic device of FIG. 1, in accordance with an embodiment.

Another example of a suitable electronic device 10, specifically a tablet device 10B, is shown in FIG. 3. The tablet device 10B may be any IPAD® model available from Apple Inc. A further example of a suitable electronic device 10, specifically a computer 10C, is shown in FIG. 4. For illustrative purposes, the computer 10C may be any MACBOOK® or IMAC® model available from Apple Inc. Another example of a suitable electronic device 10, specifically a watch 10D, is shown in FIG. 5. For illustrative purposes, the watch 10D may be any APPLE WATCH® model available from Apple Inc. As depicted, the tablet device 10B, the computer 10C, and the watch 10D each also includes an electronic display 12, input devices 14, I/O ports 16, and an enclosure 30. The electronic display 12 may display a GUI 32 with icons 34.

Figure 6:
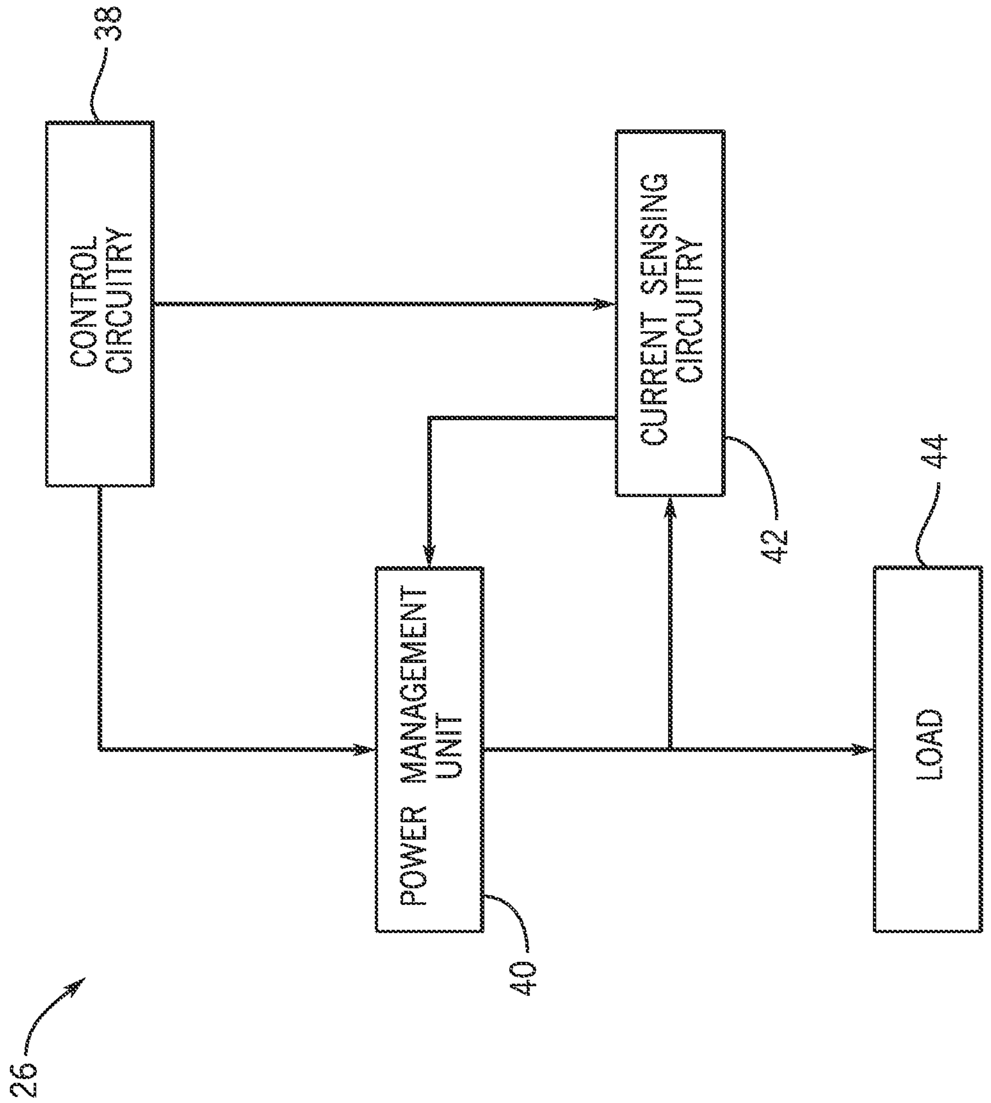
FIG. 6 is a block diagram of an example power source of the electronic device of FIG. 1, in accordance with an embodiment.

As noted above, the power source 26 may include a power management unit that controls supply of power to loads. FIG. 6 is a block diagram of an example power source 26. The power source 26 may include control circuitry 38, a power management unit (PMU) 40, current sensing circuitry 42, and a load 44. The PMU 40 may supply power to one or more loads 44. During the provision of power, the PMU 40 may receive feedback from the current sensing circuitry 42 regarding characteristics or qualities of a current supplied to a respective load 44. However, as is further described in FIG. 7, the PMU 40 may be backpowered during the current sensing. The power source 26 of FIG. 6 may use circuitry of FIGS. 8-9 to prevent the backpowering described in FIG. 7.

Figure 7:
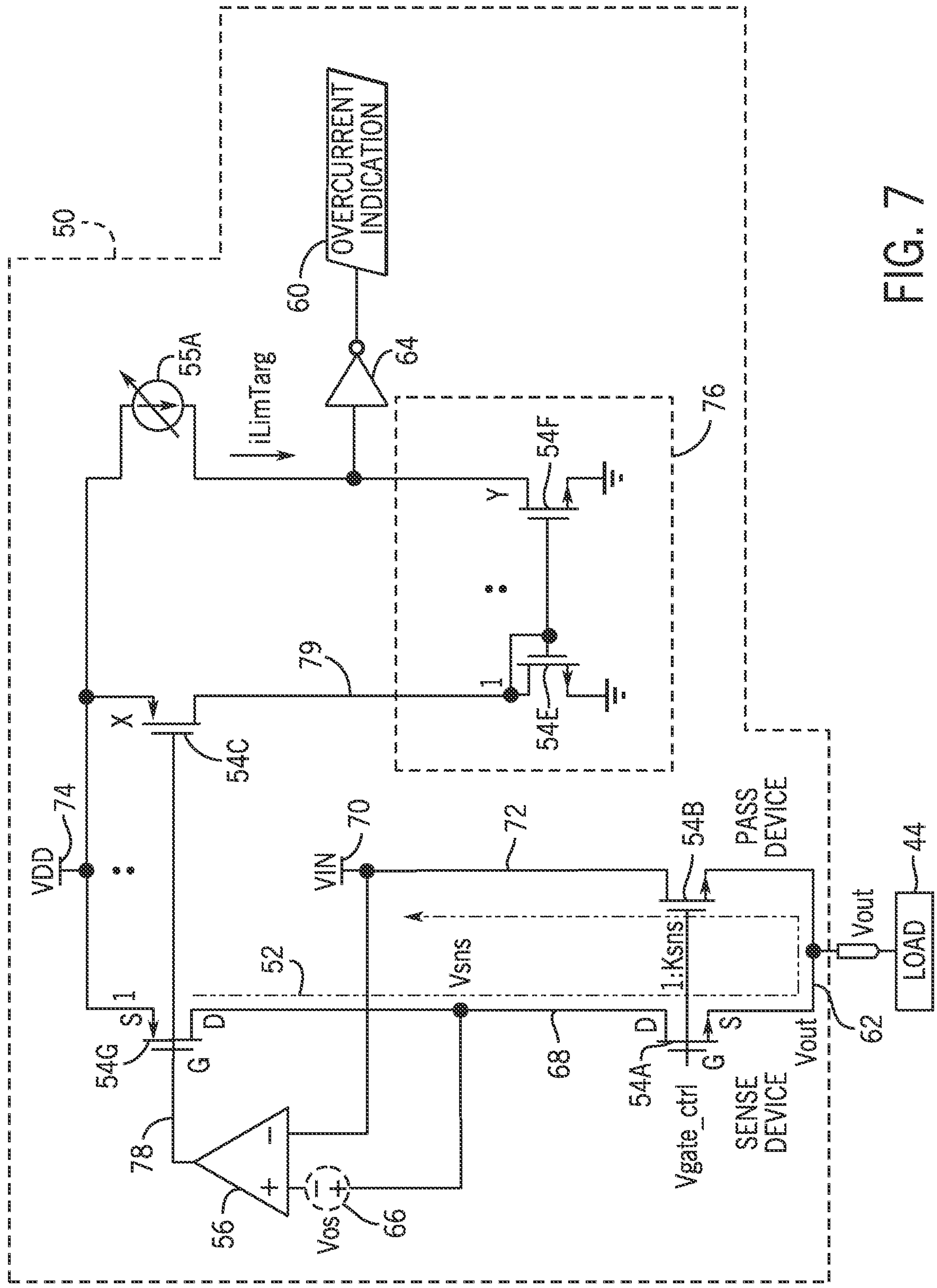
FIG. 7 is a circuit diagram of a first example of sensing circuitry of the electronic device of FIG. 1 that experiences backpowering, in accordance with an embodiment.

With the foregoing in mind, FIG. 7 is a block diagram of a first example sensing circuit 50 of the electronic device 10 illustrating backpowering (represented via arrow 52). During the backpowering, the load current 58 may equal 0 amps (A). The sensing circuit 50 may be located between a PMU 40 and a load 44, such as in the current sensing circuitry 42 of FIG. 6. However, it should be understood that the sensing circuit 50 may be located at any suitable location in the electronic device 10 where sensing a current is desired.

Figure 8:
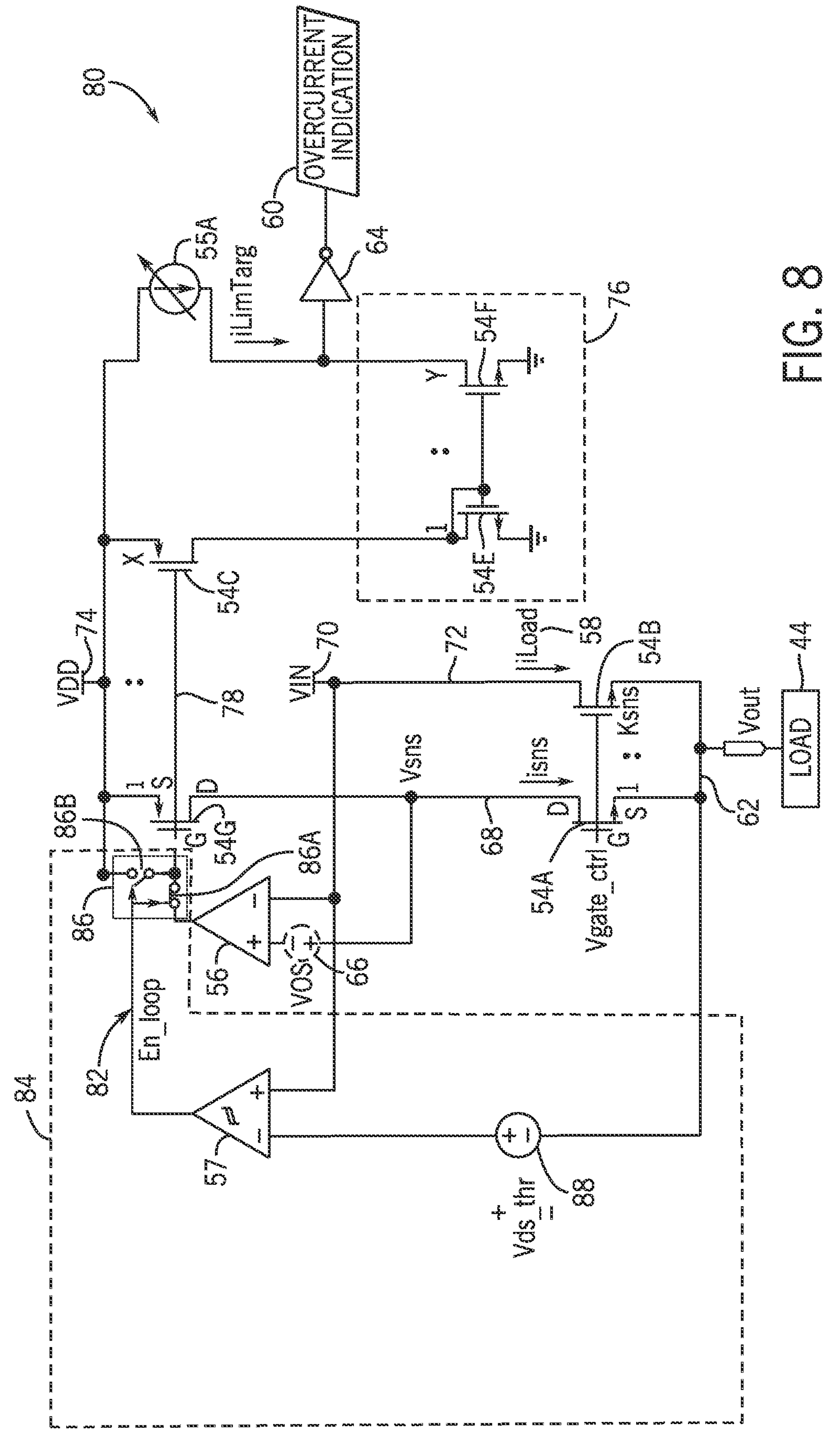
FIG. 8 is a circuit diagram of a second example of sensing circuitry of the electronic device of FIG. 1, in accordance with an embodiment.
Figure 9:
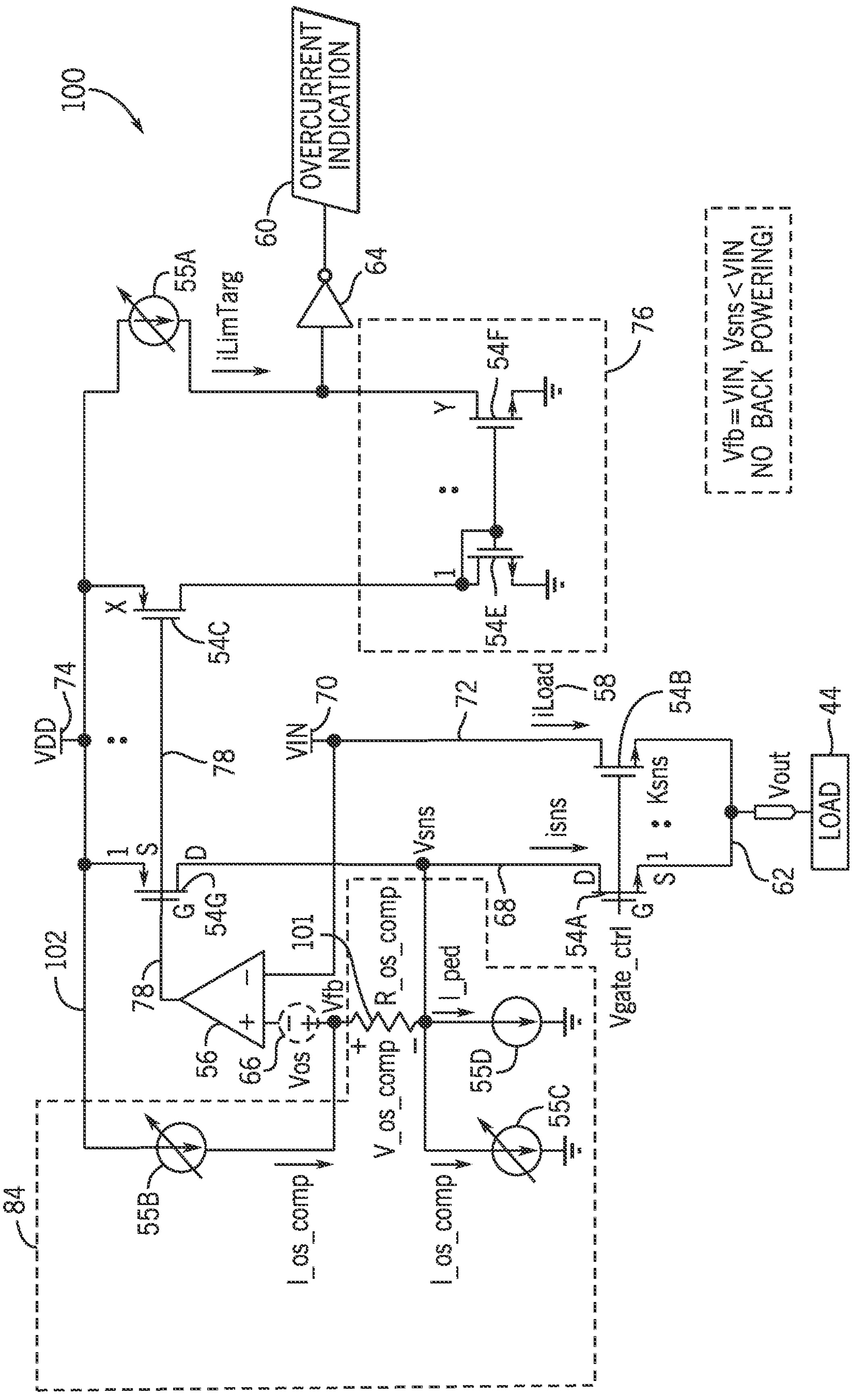
FIG. 9 is a circuit diagram of a third example of sensing circuitry of the electronic device of FIG. 1, in accordance with an embodiment.
Figure 11:
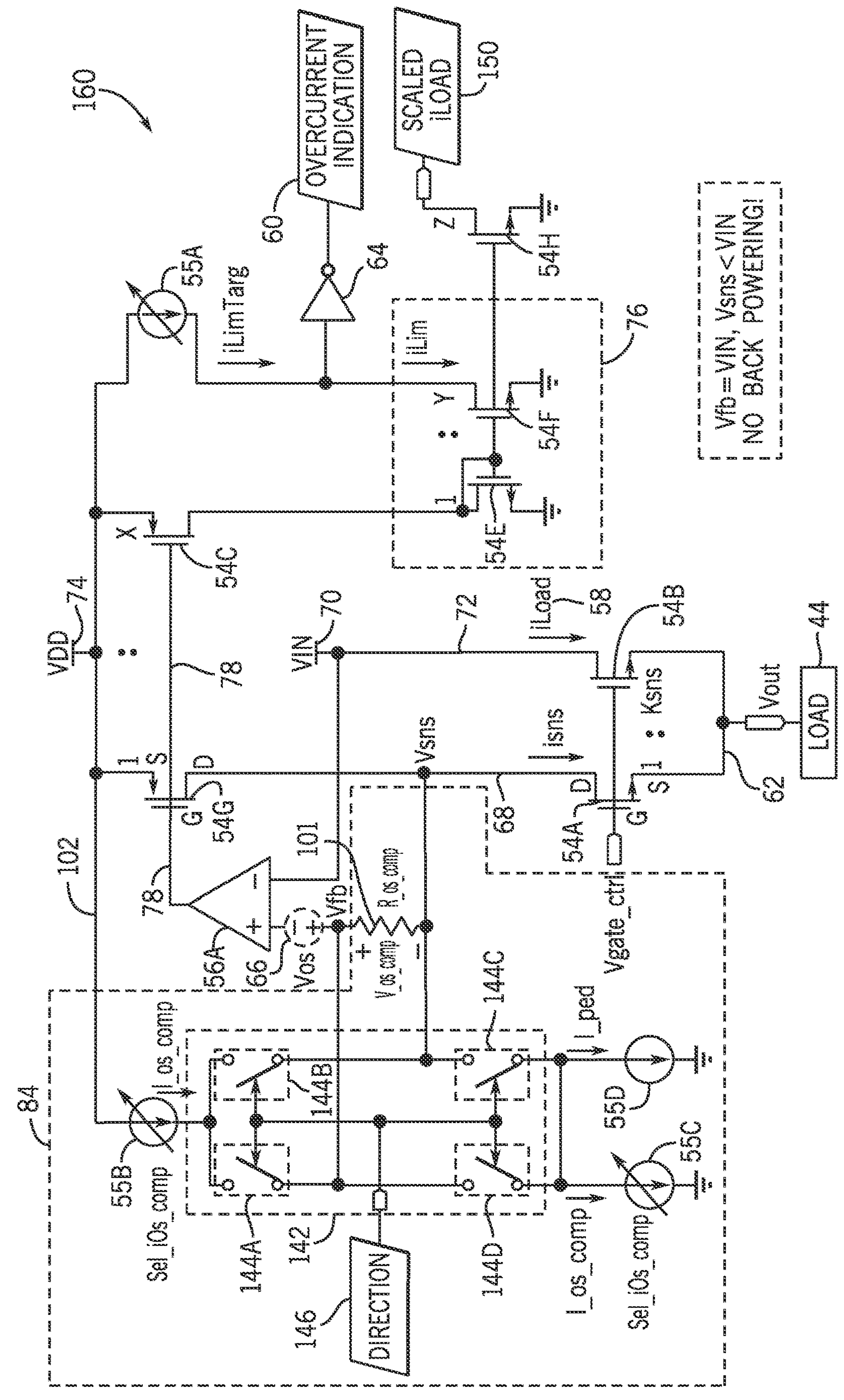
FIG. 11. is a circuit diagram of a fourth example of sensing circuitry of the electronic device of FIG. 1, in accordance with an embodiment.

Various components and signals associated with the sensing circuit 50 may be used in the sensing circuits described in FIGS. 8-9 and 11. Indeed, transistor devices 54 (sense device 54A, load switch 54B), operational amplifier (op-amp) 56, load current 58, overcurrent indication 60, node 62, inverter 64, node 68, voltage source (Vin) 70 (e.g., power source 26 or coupled to power source 26), node 72, voltage source (VDD) 74, and the like, may be repeated in the other circuit diagrams, and thus descriptions may be relied on herein. Furthermore, a sensing circuit 50 may include several transistors 54 (transistor 54A that herein is referred to as sense device 54A, transistor load switch 54B that herein is referred to as load switch 54B, transistor 54C, transistor 54E, transistor 54F, transistor 54G), which may open and close in response to the control circuitry 38 generating control signals. One or more of the transistors 54 and/or other switches described herein may use any suitable circuitry, such as a complementary metal-oxide-semiconductor field effect transistor (c-type MO SFET), negative metal-oxide-semiconductor field effect transistor (n-type MOSFET), positive metal-oxide-semiconductor field effect transistor (p-type MOSFET), or the like. Each of the transistors 54 may include a source terminal, drain terminal, and gate terminal, or another combination of terminals based on a type. Using one respective transistor 54 as an example, the transistor 54A includes a drain terminal "D" coupled to a node 68, a gate terminal that receives a gate control signal (Vgate_ctrl), and a source terminal "S" coupled to a node 62.

A voltage source (Vin) 70 may be input circuitry that receives a first source voltage (Vin) from an upstream-coupled power supply, like the power source 26. Node 62 may be coupled to a load, such as the load 44. Although the load may be any type of device or circuit load, for ease of reference, the load is referred to as load 44 herein.

Power may be delivered to the load 44 via load switch 54B from the voltage source (Vin) 70, illustrated as a transistor. Other types of switching or current delivery control circuitry may be used in place of load switch 54B. For example, the load switch 54B may be replaced by a linear and low-dropout (LDO) regulator configurable to adjust a power output from a main supply or a battery.

The sensing circuit 50 may be used to monitor a load current (iLoad) delivered to the load 44 (iLoad) from the voltage source (Vin) 70. The load current (iLoad) may be delivered to the load 44 via the load switch 54B. The load current (iLoad) may transmit via the node 62 to the load 44 and may generate an output voltage (Vout).

A sense device 54A and the load switch 54B may correspond to a current mirror. A sense current (isns) through the sense device 54A may be a scaled version of the load current (iLoad). Other current mirrors may further mirror the sense current (isns) and used to monitor or measure the load current (iLoad). The sense device 54A may be a scaled version of the load switch 54B and thus be generally similar to the load switch 54B but relatively smaller or able to conduct a lower current. Using a smaller transistor for the sense device 54A may reduce a footprint of sensing circuitry relative to circuitry that does not use a different size of transistor between the sense device 54A and the load switch 54B. A loop may be formed by the op-amp 56 and the transistor 54G. This loop may aid the current monitoring. The loop may cause the drain voltages of the sense device 54A and of the load switch 54B to be the same. Once the drain voltages are the same, the current through the sense device 54A may be a scaled version of the current through the load switch 54B. A ratio used for the scaling may equal 1:Ksns, where Ksns may be a constant greater than 1.

Gate terminals of the sense device 54A and the load switch 54B may be connected. Connecting the gate terminals of the sense device 54A and the load switch 54B, as well as other design decisions, like shorting the source node voltages of the sense device 54A and of the load switch 54B to be the same or substantively similar (e.g., a negligible amount of difference between the different node voltage values).

To power the load 44, a control signal (Vgate_ctrl) may be received via the sense device 54A and the load switch 54B. The control signal (Vgate_ctrl) may turn on the sense device 54A and the load switch 54B.

Pairs of the transistors 54 may form current mirrors, for example a current mirror 76. The pair of transistors 54A, 54B (e.g., the sense device 54A and the load switch 54B) may form a current mirror characterized with a scaling ratio of 1:Ksns. The pair of transistors 54G, 54C may form a current mirror characterized with a scaling ratio of 1:X. The pair of transistors 54E, 54F may form a current mirror characterized with a scaling ratio of 1:Y. For each of the current mirrors, the scaling ratio (e.g., Ksns, X, Y) may be based on a constant having any suitable value and may be based on the material properties of the transistors 54, such as a channel width, channel length, or the like.

The op-amp 56 may compare voltages at its inputs and output a signal via node 78, which may be used as a gate control signal for transistors 54G and 54C. The scaled version of the iLoad current (e.g., scaled current equals iLoad/Ksns) may be transmitted via the transistor 54G and transmitted, with scaling by constant X, via the transistor 54C. A twice-scaled iLoad current (iLim) (e.g., iLim=iLoad*(Y*X/Ksns)) may transmit via the transistor 54F after the once-scaled iLoad current (e.g., iLoad*(X/Ksns)) turns on the transistors 54E and 54F. When turned on, the transistor 54F may scale a current transmitted via the transistor 54E by a constant, Y. A fixed output current source 55A and may generate a fixed current output (iLimTarg). The current source 55A may operate based on a digital-to-analog converter (DAC). When the twice-scaled iLoad current (iLim) is greater than the fixed current output (iLimTarg), a flag may be generated (e.g., overcurrent indication 60) via the inverter 64.

During ideal operation (e.g., when the offset voltage (Vos) 66 is not affecting a positive input to the op-amp 56), the loop connections may try to make the drain voltages equal, which may cause a current (iLoad) to transmit to the load 44. However, since the comparator 57 may not be ideal, the offset voltage (Vos) 66 may sometimes be present at the positive input or internal to the op-amp 56. Indeed, the offset voltage (Vos) 66 may not be a physical voltage source and instead may be an internal offset voltage of the non-ideal op-amp 56, shown outside the op-amp 56 for ease of description and modelling. In these non-ideal cases, the loop connections may change how current is transmitting to the load, which may backpower the voltage source (Vin) 70. Once backpowered, the current sensing operations and/or overcurrent indication 60 generation operations may not operate desirably, leaving the voltage source (Vin) 70 open to damage or misoperation. Backpowering the voltage source (Vin) 70 may be undesired since the additional current into the voltage source (Vin) 70 may damage related circuitry due to the circuitry not being made to withstand the additional current. Even if the voltage source (Vin) 70 has over voltage protection, the issue of increase quiescent current consumption due to the backpowering would still be present (e.g., undesired power consumption while the device is idle), which may undesirably impact operation of the electronic device 10.

To prevent backpowering, backpower reduction circuitry may be included in the circuit 50 of FIG. 7 to prevent backpowering when using a non-ideal op amp 56. To elaborate, FIG. 8 is a circuit diagram of a second example sensing circuit 80 of the electronic device 10, FIG. 9 is a circuit diagram of a third example sensing circuit 100, and FIG. 11 is a circuit diagram of a fourth example sensing circuit 160, each of which prevent backpowering. For ease of explanation, certain circuitry and operation descriptions made below with reference to FIG. 8 may also apply to circuitry and operations of FIG. 9 and/or FIG. 11. In each of the example of FIGS. 8, 9, and 11, additional or less circuitry may be included in an actual implementation.

A suitable voltage across the load switch 54B may be used to overcome the offset voltage (Vos) 66 of the op-amp 56 before enabling a circuit loop 82. This may be done by including backpower reduction circuitry 84 to ensure that current is transmitted away from the voltage source (Vin) 70.

The backpower reduction circuitry 84 may ensure that the node 68 voltage (Vsns) is less than a voltage of the voltage source (Vin) 70. It is noted that these systems and methods of backpowering prevention described with reference to FIG. 8 may be considered a digital solution while those described with reference to FIGS. 9 and 11 may be considered an analog solution.

To elaborate on FIG. 8, when the backpower reduction circuitry 84 is included, the non-ideal op-amp 56 may be used to monitor the load current 58 (iLoad) without backpowering. The backpower reduction circuitry 84 may include a comparator 57. The comparator 57 may compare a threshold voltage (Vds_thr) generated via a voltage source 88 to a drain-source voltage of load switch 54B. The voltage threshold (Vds_thr) may be set based on a resistance of the voltage source 88 and correspond to a worst case offset voltage (Vos) 66. For example, the voltage source 88 may include a current source and a resistor to generate the fixed voltage of the voltage source 88.

An output from the comparator 57 may transmit as an enable loop control signal (En_loop) and may have a high logic value (e.g., high output) or a low logic value (e.g., low output). When the drain-source voltage of load switch 54B exceeds the threshold voltage (Vds_thr), the comparator 57 generates a high output to switches 86. The high output may cause normally open (NO) switch 86A to close and normally closed (NC) switch 86B to open.

When the drain-source voltage of load switch 54B does not exceed the threshold voltage (Vds_thr), the comparator 57 generates a low output to switches 86. The low output may cause normally open (NO) switch 86A to remain open and normally closed (NC) switch 86B to remain closed. This configuration of the switches 86 may enable a default configuration of having the op-amp 56 coupled to the voltage source (VDD) 74 as opposed to turning on the transistor 54G, thereby stopping current flow through the sense device 54A. Thus, although a load current may continue to transmit to the load 44 from the voltage source (Vin) 70, the low output from the comparator 57 may stop a sensing operation until the output from the comparator 57 changes to a high output, thereby preventing backpowering.

As noted above, another example of backpower reduction circuitry 84 is shown in FIG. 9. FIG. 9 a circuit diagram of a third example sensing circuit 100 that may be used in the electronic device 10. Although a certain combination of components are illustrated herein and in FIG. 8, it should be understood that additional or fewer components may be included in the third example sensing circuit 100 and/or the second example sensing circuit 80. Furthermore, although not illustrated, the third example sensing circuit 100 may be coupled upstream from the load 44 that receives a current from one or more of the transistors 54 and/or the overcurrent indication 60. Additionally, the third example sensing circuit 100 may be coupled downstream from control circuitry 38 that may generate one or more control signals to operate the third example sensing circuit 100 to perform some or all of the sensing operation and a voltage source circuit responsible for providing the voltage source (VDD) 74 and the voltage source (Vin) 70. Before continuing, it is noted that the systems and methods of backpowering prevention described with reference to FIG. 8 may be considered a digital solution while those described with reference to FIG. 9 may be considered an analog solution. The circuitry of FIGS. 8, 9, and 11 may be used separately or together in a single system. Thus, the circuitry of FIGS. 8, 9, and 11 may be combined in a system that includes both analog and digital solutions.

The backpower reduction circuitry 84 of FIG. 9 may include current sources 55 (current source 55B, current source 55C, current source 55D). Node 102 may couple to the current source 55B, the transistor 54G, the transistor 54C, and the current source 55A. The output current from the current sources 55B and 55C may be programmable based on control signals from control circuitry (e.g., control circuitry 38) and a resistor 101 (e.g., resistive device having a resistance of R_os_comp). A current (I_ped) may be transmitted by the current source 55D. A current (I_os_comp) may be transmitted by the current source 55B. A current (I_os_comp) may be transmitted by the current source 55C. The resistor 101 may be a physical resistor component coupled between the current source 55D and an input to the op-amp 56. A positive input of the op-amp 56 may be coupled to the resistor 101, the sense device 54A, the current source 55D, the current source 55C, and the current source 55B. A negative input of the op-amp 56 may be coupled to the load switch 54B via a node 72 and input source (VIN) 70.

The current from the current source 55B may transmit through the resistor 101 and generate a compensation voltage (V_os_comp). A value of the current from the current source 55B and a value of the resistance of the resistor 101 may be selected to generate a suitable voltage as the compensation voltage to compensate for the offset voltage (Vos) 66 of the non-ideal op-amp 56. By compensating for the offset voltage (Vos) 66, the third example sensing circuit 100 may prevent backpowering.

In some embodiments, the backpowering may occur for the load currents (iLoad) that generate a voltage across the load switch 54B that is smaller than the negative of the offset voltage (Vos) 66. In other words, if the load current (iLoad) multiplied by the on-resistance of the load switch 54B results in a voltage value that is less than or equal to the negative of the offset voltage (Vos) 66 (e.g., –Vos), backpowering may occur. If the load current (iLoad) multiplied by the on-resistance of the load switch 54B results in a voltage value that is greater than the negative of the offset voltage (Vos) 66, the backpowering may not occur since the voltage drop of the load switch 54B overcomes the offset voltage (Vos) 66.

Figure 10:
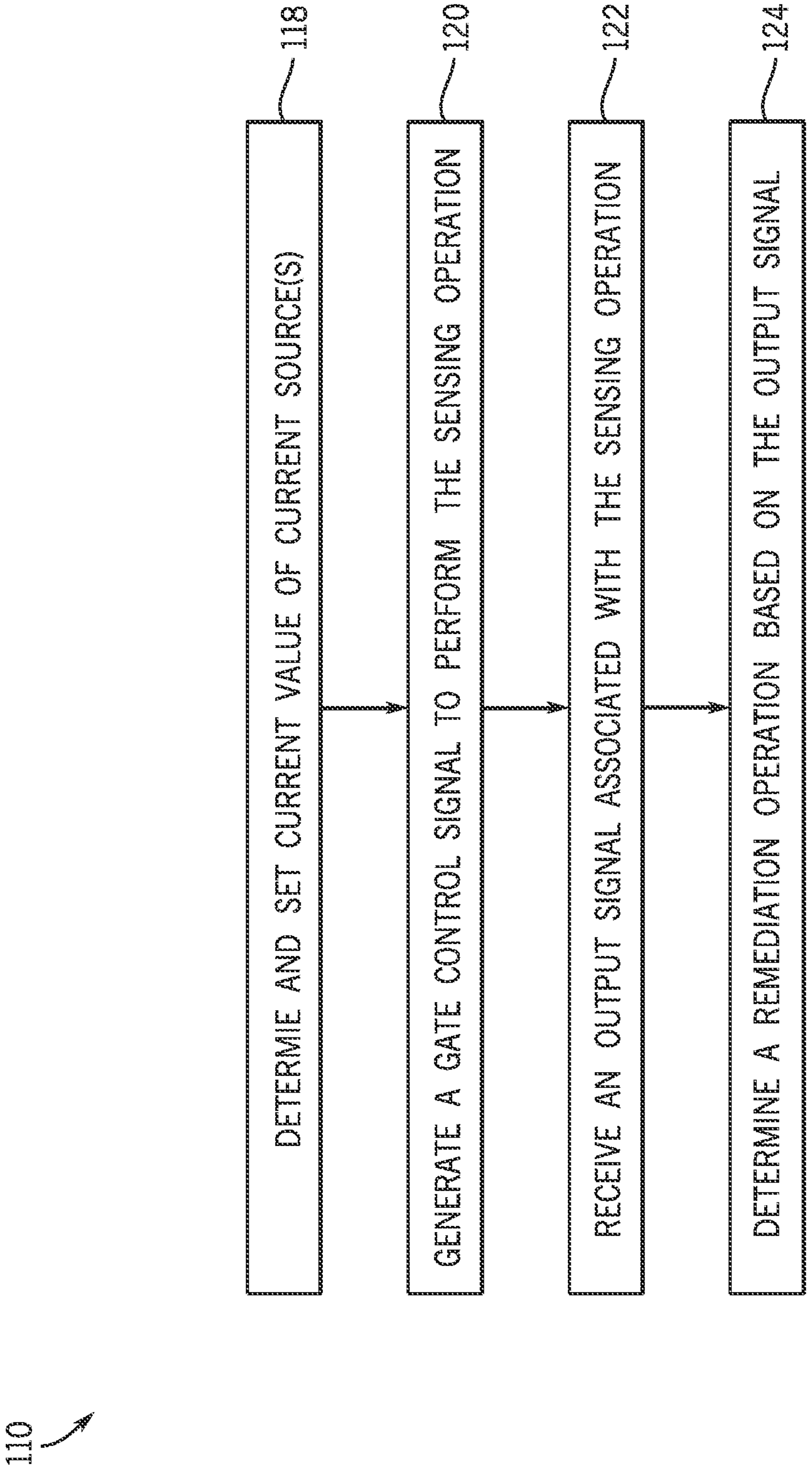
FIG. 10 is a flowchart of a method for operating backpower prevention circuitry to stop backpowering the power source of FIG. 6, in accordance with an embodiment.

Keeping the foregoing in mind, operations of the control circuitry 38 may be summarized in FIG. 10. FIG. 10 is a flowchart of a method 110 for operating backpower reduction circuitry 84 to stop backpowering in the voltage source (Vin) 70. Although the method 110 is described below as performed by the control circuitry 38, it should be noted that the method 110 may be performed by any suitable processor that may control current sensing. Moreover, although the following description of the method 110 is described in a particular order, it should be noted that the method 110 may be performed in any suitable order.

At block 118, the control circuitry 38 may set one or more current sources 55 (e.g., programmable current sources 55A, 55B, and/or 55C) to a resistance. Changing a resistance of a transistor internal to the current source 55 may change the current transmitted from the current source 55. The control circuitry 38 may adjust the amount of current transmitted via the current sources 55 in response to receiving an indication to perform a sensing operation or otherwise determining to perform or preparing to perform a sensing operation. The indication may be generated by a sub-system of the control circuitry 38, by a portion of the processor core complex 18, in response to an input via input devices 14, or the like. The control circuitry 38 may read one or more registers to determine the current value to respectively set the current sources 55.

At block 120, the control circuitry 38 may generate one or more gate control signals to perform the sensing operation requested at block 112. The one or more gate control signals may include Vgate_ctrl delivered to the sense device 54A and the load switch 54B.

At block 122, the control circuitry 38 may receive an output signal associated with the sensing operation, such as the overcurrent indication 60, which may be a voltage signal. Since backpowering is stopped by the backpower reduction circuitry 84, normal sensing operations may commence, which may result in the generation of the overcurrent indication 60.

At block 124, the control circuitry 38 may determine and perform an operation based on the output signal (e.g., perform a remediation operation). For example, in response to the overcurrent indication 60, the control circuitry 38 may adjust signals delivered to the load 44 to pause or reduce power supplied as to not damage circuitry of the load 44.

Keeping the foregoing in mind, in FIG. 9, the sensing circuit 100 may compensate for negative offset voltage (Vos) 66. A positive offset experience by the sensing circuit 100 may cause the sensing circuit 100 to become relatively insensitive to relatively small load currents, which may not generate a suitable amount of voltage drop across the load switch 54B to overcome the positive offset voltage (Vos) 66. This may create a "dead-zone" of compensation. The positive offset voltage (Vos) 66 may still be tolerated, as long as it is within an acceptable limit, for some current limit detection applications, which normally may have relatively high threshold values (e.g. greater than 1.5 Amps (A)) to generate a current limit detection event.

Given this limitation of using the sensing circuit 100, it may nonetheless be sometimes desirable to compensate for positive offset voltages. In these cases, the sensing circuit of FIG. 11 may be used to compensate for both negative and positive offset voltages (Vos) 66.

Indeed, another embodiment of the sensing circuitry, sensing circuitry is shown in FIG. 11. FIG. 11 is a circuit diagram of a fourth example sensing circuit 160. Although described with reference to FIG. 10, operations of the method 110 may be similarly applied to the sensing circuit 160. For ease of explanation, certain circuitry and operation descriptions made above with reference to FIGS. 8 and 9 may also apply to circuitry and operations of FIG. 11.

The sensing circuit 160 may sense a sign of the offset voltage (Vos) 66 and may set a direction of current flow through the resistor 101 based on the sensed sign of the offset voltage (Vos) 66. With this improvement, the dead zone of the current sensing circuit 100 may be reduced in the current sensing circuit 160 to a post-trim accuracy of offset compensation. Indeed, by enabling compensation of both positive and negative offset voltage (Vos) 66, the sensing circuit 160 may be used in sensing continuous current applications. These sensing signals may be sent to an analog-to-digital converter (ADC) for telemetry and current monitoring purposes, in addition to detecting current limits. Furthermore, the sensing circuit 160 may generate the same overcurrent indication 60 described in the earlier sensing circuits 80, 100 to provide overcurrent protection. The overcurrent indication 60 may cause the control circuitry 38 to stop sending the control signal (Vgate_ctrl) to the load switch 54B and the sensing device 54A. In some cases, the control circuitry 38 may generate a notification to a user or to another subsystem of the electronic device 10 based on the overcurrent indication 60, to notify external to the sensing circuit 160 that an overcurrent condition that occurred. To elaborate, the sensing circuit 160 may include offset compensation direction selection switches 142, which may include one or more transmission gates 144 (transmission gate 144A, transmission gate 144B, transmission gate 144C, transmission gate 144D). The transmission gates 144 may be similar to the transistors 54 and/or may be other types of switches. The offset compensation direction selection switches 142 may be coupled in a manner to enable a direction control signal 146 to set the direction of the current flow through the resistor 101. When the direction control signal 146 has a logic high value (e.g., "1", suitable high voltage level), the transmission gates 144 may be operated into an open/close combination to trim the negative offset voltage (Vos) 66 using a generated positive voltage across the resistor 101. When the direction control signal 146 has a logic low value (e.g., "0", suitable low voltage level), the transmission gates 144 may be operated into an open/close combination to trim the positive offset voltage (Vos) 66 using a generated negative voltage across the resistor 101. The voltages generated across the resistor 101 may be unequal in magnitude but opposing in sign to the offset voltage (Vos) 66. In some cases, the currents generated by the current sources 55 may be selected such that the voltages generated across the resistor 101 may be equal in magnitude but opposing in sign to the offset voltage (Vos) 66.

Here, the output from the current sense operation can also be transmitted to an ADC as a scaled iLoad current 150, which may be used for current telemetry operations (e.g., remote current sensing). The scaled iLoad current 150 may be a current generated based on a current mirror corresponding to transistors 54E, 54F, and 54H. The current transmitted as the scaled iLoad current 150 may equal X*Z*iLoad/Ksns, and thus represent a scaled version of the load current through the load switch 54V. The scaled iLoad current 150 may be an analog signal that a downstream ADC converts into a digital signal for further use by systems of the electronic device 10 and/or the control circuitry 38.

The compensation operation (e.g., trimming) of the offset voltage (Vos) may be based on a least significant bit (LSB) of one or more of the current sources 55B, 55C, and/or 55D. Thus, there may be a relatively small residual voltage of the offset voltage (Vos) 66 after the compensation operation due to the LSB of one or more current sources 55. The residual current may amount to a 50 miliamp (mA)-200 mA dead zone of compensation operations where current sensing may be unable to be performed. For example, even if the iLoad current is 55 mA, 90 mA, 195 mA (or another value between 45 mA and 205 mA), the scaled iLoad current 150 may be OA due to the dead zone.

To avoid a conflict between an ADC output of OA and an actual load current of a non-zero value, and thus avoid an inaccurate current reading, a flag (e.g., ADC_valid flag) may be used to describe whether the ADC sensing current output is a valid measurement. One way to achieve this may be to monitor the op-amp 56 output voltage.

When the loop is saturated, the op-amp 56 output voltage is negligibly different from a voltage of the voltage source (VDD) 74, which may cause the transistor 54G and 54C to be off. While off, the scaled iLoad current 150 may be inaccurate. Thus, current sensing validity may be determined by monitoring the op-amp 56 output voltage.

For example, the control circuitry 38 may sense the op-amp 56 output voltage and compare the sensed voltage to a threshold, which may equal or be substantially similar to the voltage value of the voltage source (VDD) 74. The threshold may be a threshold range. When the control circuitry 38 determines that the output voltage of the op-amp 56 equals the threshold (or is within the threshold range of voltages), the control circuitry 38 may generate the ADC_valid flag to indicate that the scaled_iLoad current 150 may not be accurate. The control circuitry 38 may continuously monitor the output voltage of the op-amp 56. Once the output voltage of the op-amp 56 is not equal to the threshold (or outside the threshold range), the control circuitry 38 may change the value of the ADC_valid flag (e.g., de-assert) to communicate that the scaled_iLoad current 150 once again reflects a scaled version of the iLoad current transmitted the load switch 54B.

Furthermore, in some cases, the sensing circuits 80, 100, and/or 160 may be used in ambient environments with variable temperature. The offset voltage (Vos) 66 may be a temperature-dependent value. Thus, the accuracy of the compensation operation of the offset voltage (Vos) may change as temperature changes. To compensate for the changes in temperature, the control circuitry 38 may change a value of the current output from the current sources 55B and/or 55C (e.g., change the sign of the current I_os_comp and I_os_comp). Furthermore, the resistor 101 may be selected to have characteristics that are stable in expected operating conditions of the electronic device 10. Between selecting the resistance of the resistor 101 and changing the current output from one or more of the current sources 55, the control circuitry 38 may design the voltage generated across the resistor 101 (V_os_comp) to have a same (or substantially similar) temperature coefficient as the current sensing. When the voltage generated across the resistor 101 (V_os_comp) has a temperature coefficient that matches that of the current sensing, any change in temperature similarly affects electrical characteristics of both the resistor 101 and the op-amp 56, enabling compensating of the offset voltage (Vos) 66 even in variable temperature environments.

Other circuitry may be suitable to compensate the offset voltage (Vos) 66 by controlling, during a sensing operation, a sense device input current to be less than a pass device input current associated with the non-ideal op-amp 56. Moreover, in some systems, the first example of the backpower reduction circuitry 84 and the second example of the backpower reduction circuitry 84 may both be used in an electronic device 10.

The present disclosure describes systems and methods that reduce a likelihood of or prevent backpowering of a voltage source (Vin) used to supply a load during a load current sensing operation. Technical effects of doing so include increasing a lifespan of the voltage source (Vin) and/or the electronic device by reducing occurrences of unexpected backpowering that cause component degrade and improving efficiency of power consumed by reducing a likelihood that power is undesirably consumed through the backpowering.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system, comprising:

input circuitry configured to receive a first source voltage (Vin) from a power supply;

a drain terminal of a first transistor coupled to the input circuitry;

backpower reduction circuitry configured to prevent a load current from transmitting into the power supply via the first transistor based on a voltage associated with a drain terminal of a second transistor being greater than a voltage associated with the drain terminal of the first transistor; and control circuitry configured to:

receive an overcurrent indication generated based on the load current; and adjust a value of the load current based on the overcurrent indication.

2. The system of claim 1, wherein the backpower reduction circuitry comprises a comparator and a voltage source, and wherein the backpower reduction circuitry is configured to prevent the load current from transmitting into the power supply based on a comparison made via the comparator between a voltage across the first transistor and a voltage of the voltage source.

3. The system of claim 2, wherein a negative input of the comparator is coupled to the voltage source, and wherein a positive input of the comparator is coupled to the drain terminal of the first transistor.

4. The system of claim 3, wherein the positive input of the comparator is coupled to a negative input of an operational amplifier, and wherein a positive input of the operational amplifier is coupled to the drain terminal of the second transistor.

5. The system of claim 1, wherein the backpower reduction circuitry is associated with an operational amplifier, a programmable current source, and a resistor, and wherein the operational amplifier is characterized with an offset voltage.

6. The system of claim 5, wherein the programmable current source is configurable to generate a current that, when transmitted via the resistor, results in a compensation voltage having an opposite sign relative to a sign of the offset voltage, and wherein the voltage associated with the drain terminal of the second transistor is set based on the compensation voltage.

7. The system of claim 6, wherein the backpower reduction circuitry comprises a plurality of switches configured to couple between the programmable current source and the resistor.

8. The system of claim 5, wherein the control circuitry is configured to:

sense a voltage output from the operational amplifier, wherein the sensed voltage corresponds to whether a current mirror is outputting a scaled version of the load current;

determine that the sensed voltage equals a threshold; and generate a notification in response to determining that the sensed voltage equals the threshold, wherein the notification is configured to indicate that the scaled version of the load current output from the current mirror is inaccurate.

9. A circuit, comprising:

input circuitry configured to receive a first source voltage (Vin) from a power supply;

a first transistor comprising:

a source terminal coupled to a load; and a drain terminal coupled to the input circuitry;

backpower reduction circuitry configured to prevent a load current from transmitting into the power supply based on a presence of an offset voltage; and control circuitry configured to:

receive an overcurrent indication generated based on the load current; and adjust a value of the load current based on the overcurrent indication.

10. The circuit of claim 9, comprising:

an operational amplifier configured to generate an output voltage that controls transmission of a sensing current based on the load current;

wherein the backpower reduction circuitry comprises:

a comparator coupled to the input circuitry; and a voltage source coupled to a first input of the comparator;

wherein the comparator controls a plurality of switches to transmit the output voltage based on a difference between a voltage of the voltage source and a voltage across the first transistor; and wherein a negative input of the comparator is coupled to a source terminal of a sense device, and wherein an output of the comparator is coupled to an output of the operational amplifier via a switch, wherein the switch is configured to control the transmission of the sensing current in response to the output voltage from the operational amplifier.

11. The circuit of claim 10, wherein the negative input of the operational amplifier is coupled to the voltage source, and wherein a positive input of the comparator is coupled to the drain terminal of the first transistor.

12. The circuit of claim 11, wherein the positive input of the comparator is coupled to the negative input of the operational amplifier.

13. The circuit of claim 9, comprising:

an operational amplifier configured to generate an output voltage that controls transmission of a sensing current based on the load current;

wherein the backpower reduction circuitry comprises:

a first current source coupled to a positive input to the operational amplifier; and a resistor coupled to the positive input, wherein the resistor is configured to generate a compensation voltage based on a current from the first current source, and wherein the compensation voltage is an opposite sign relative to a sign of the offset voltage.

14. The circuit of claim 13, wherein the backpower reduction circuitry comprises a plurality of transmission switches coupled to the resistor and the first current source.

15. A device comprising:

input circuitry configured to receive a first source voltage (Vin) from a power supply;

a drain terminal of a first transistor coupled to the input circuitry;

backpower reduction circuitry configured to reduce a value of a load current transmitted into the power supply based on a presence of an offset voltage; and control circuitry configured to:

receive an overcurrent indication generated based on the load current; and adjust a value of the load current based on the overcurrent indication.

16. The device of claim 15, wherein the first transistor comprises a source terminal coupled to a load.

17. The device of claim 15, comprising:

an operational amplifier configured to generate an output voltage that controls transmission of a sensing current based on the load current;

wherein the backpower reduction circuitry comprises:

a first current source coupled to a positive input to the operational amplifier; and a resistor coupled to the positive input, wherein the resistor is configured to generate a compensation voltage based on a current from the first current source, and wherein the compensation voltage is an opposite sign relative to a sign of the offset voltage.

18. The device of claim 15, wherein the backpower reduction circuitry is associated with an operational amplifier, a programmable current source, and a resistor, and wherein the operational amplifier is associated with the offset voltage.

19. The device of claim 18, wherein the programmable current source is configurable to generate a current that, when transmitted via the resistor, results in a compensation voltage having an opposite sign relative to a sign of the offset voltage.

20. The device of claim 15, wherein the backpower reduction circuitry comprises one or more programmable current sources.

* * * * *